United States Patent [19]

Tran et al.

[11] Patent Number: 5,420,452
[45] Date of Patent: May 30, 1995

[54] SOLID STATE RADIATION DETECTOR

[75] Inventors: Nang T. Tran, Cottage Grove; John C. Dahlquist, Maplewood, both of Minn.

[73] Assignee: Minnesota Mining and Manufacturing Company, St. Paul, Minn.

[21] Appl. No.: 138,622

[22] Filed: Oct. 18, 1993

Related U.S. Application Data

[63] Continuation of Ser. No. 884,607, May 15, 1992, abandoned, which is a continuation of Ser. No. 478,201, Feb. 9, 1990, abandoned.

[51] Int. Cl.$^6$ .................... H01L 27/14; H01L 29/04; H01L 31/06
[52] U.S. Cl. ..................... 257/428; 257/429; 257/72; 257/44.4
[58] Field of Search ............. 357/30, 29, 32, 23.7; 250/370.08, 370.09; 257/428, 429, 72, 444

[56] References Cited

U.S. PATENT DOCUMENTS

| | | | |
|---|---|---|---|
| 4,067,104 | 1/1978 | Tracy | 357/17 |
| 4,069,355 | 1/1978 | Lubowski et al. | 427/70 |
| 4,200,473 | 4/1980 | Carlson | 357/30 |
| 4,382,187 | 5/1983 | Fraleux et al. | 357/32 |
| 4,467,342 | 8/1984 | Tower | 257/443 |
| 4,660,095 | 4/1987 | Cannella et al. | 358/294 |
| 4,670,765 | 6/1987 | Nakamura et al. | 357/30 |
| 4,672,454 | 6/1987 | Cannella et al. | 358/213.1 |
| 4,675,739 | 6/1987 | Catchpole et al. | 358/213.1 |
| 4,689,487 | 8/1987 | Nishiki et al. | 250/361 |
| 4,785,186 | 11/1988 | Street et al. | 250/370.14 |
| 4,810,881 | 3/1989 | Berger et al. | 250/370.0 |
| 4,982,095 | 1/1991 | Takahashi et al. | 250/367 |

FOREIGN PATENT DOCUMENTS

| | | |
|---|---|---|
| 0163956 | 12/1985 | European Pat. Off. |
| 0175578 | 3/1986 | European Pat. Off. |
| 8204003 | 9/1983 | France. |
| 3829912A1 | 9/1988 | Germany. |
| 61-196570 | 8/1986 | Japan. |
| 61-196571 | 8/1986 | Japan. |
| 61-196572 | 8/1986 | Japan. |
| 61-196582 | 8/1986 | Japan. |

OTHER PUBLICATIONS

Weisfield et al, "Materials Research Society", *Amorphous Silicon Thin Film Transistor Array Technology: Applications in Printing and Document Scanning*, vol. 95, pp. 469–474 (1987). Mater. Res. Soc. Symp. Proc. vol. 95.

Thompson et al, "Digest of Technical Papers", *Page Width a–Si Image Scanner Technology*, vol. XX, pp. 259–261. May 1989 SID Int. Symp. Balt. Md.

Carlson et al, "Amorphous Silicon Solar Cell", *Applied Physics Letters*, vol. 28, No. 11, pp. 671–673, Jun. 1, 1976.

Nemanich, "Schottky Barriers on a–Si:H", *Semiconductors and Semimetals*, vol. 21, Part C, pp. 375–406, 1984.

Nemanich et al, "Initial Reactions at the Interface of PT and Amorphous Silicon", *J. Vac. Sci. Technol. B*, pp. 519–523, Aug. 1983.

Thompson et al, "Silicide Formation in Pd–a–Si:H Schottky Barriers", *Appl. Phys. Lett.*, pp. 274–276, Aug. 1, 1981.

Deneuville et al, "Influence of Preparation Conditions on Forward–Bias Currents of Amorphous Silicon Schottky Diodes", *J. Appl. Phys.*, pp. 1414–1421, Mar. 1979.

Wronski et al, "Surface States and Barrier Heights of Metal–Amorphous Silicon Schottky Barriers", *Solid State Communications*, vol. 23, pp. 421–424, 1977.

Weimer et al, "Mulitelement Self-Scanned Mosaic Sensors", *ICCE Spectrum*, pp. 52–65, Mar. 1969.

*Primary Examiner*—Jerome Jackson
*Attorney, Agent, or Firm*—Gary L. Griswold; Walter N. Kirn; Steven J. Shumaker

[57] ABSTRACT

A radiation detection device includes a plurality of pixels, each pixel includes a thin film transistor and a photodiode conductively connected to a gate of the thin film transistor with the photodiode generating a current when the pixel is exposed to x-rays.

21 Claims, 9 Drawing Sheets

SOLID STATE RADIATION DETECTOR

This is a file wrapper continuation of application Ser. No. 07/884,607, filed May 15, 1992, now abandoned, which is a continuation of application Ser. No. 07/478,201, filed Feb. 9, 1990, now abandoned.

BACKGROUND OF THE INVENTION

The present invention relates to x-ray sensing arrays, and in particular, it relates to arrays that detect x-rays for conversion to digital.

In medical diagnostic applications, the image of a human body is recorded on photographic film sensitive to x-rays. Phosphor-containing screens sensitive to x-rays are placed between the human body and the film to reduce the x-ray dose rate. The combination of x-ray film and phosphor-containing screens produces a radiograph with good resolution (5 line pairs/MM). However, the film requires a substantial amount of time to develop and the image on the film is not in a form that readily lends itself to computer storage or analysis.

Efforts have been made to replace x-ray film in radiology through the use of x-ray intensifiers, video cameras, displays, and non-film detectors. One such system employs a scintillation crystal to convert x-rays to corresponding visible light radiation, "Digital Slot Radiography Based on a Linear X-ray Image Intensifier and Two-Dimensional Image Sensors", Beerlage, Levels, and Mulder, SPIE Vol. 626 Medicine, XIV/PACS IV, pages 161–169 (1986). A photodetector is then used to generate an electrical signal corresponding to the intensity of the visible light radiation. The electrical signal from the detector is converted to digital data and stored in a memory device or electrically displayed, such as on a cathode ray tube.

Solid state detectors have also been used in x-ray astronomy. One such detector system was reported in "Multi-Element Self-Scanned Mosaic Sensors", Weimer et al, IEEE Spectrum, March 1969, pages 52–65. The system included arrays consisting of a matrix of photodiodes which are charged by light to produce electron-hole pairs.

The Catchpole et al U.S. Pat. No. 4,675,739 describes an incident radiation solid state sensing array made of photosensing elements. Each photosensing element includes back-to-back diodes, one a photo-responsive diode and the other, a blocking diode. Each of the diodes has an associated capacitance formed by its electrodes. The magnitude of the charge remaining on a given capacitor is sensed and relates back to the intensity of the incident radiation impinging upon the photosensitive diode. Furthermore, in such a linear photodiode array, the scanning time is so long that real time read-out is made impractical. In addition, the linear photodiode array has to be moved to obtain a two-dimensional image.

Another solid state sensing array includes charge-coupled devices. Charge-coupled devices have a layer of relatively conductive semi-conductor material separated from a layer containing electrodes by an insulator in a two-dimensional image sensing array. However, charge-coupled devices can presently be produced at a format of less than 1 inch by 1 inch. Larger formats of arrays have charge transfer problems due to the number of defect devices that can exist in one line of the array. A defective device in one line of the array can result in a charge not being transferred through that line in the array.

The Nishiki et al U.S. Pat. No. 4,689,487 describes the use of a large area solid state detector (40 cm×40 cm). This solid state detector includes pixels in 2,000×2,000 matrix form. Each pixel consists of a photodiode conductively connected in parallel to a capacitor which are both then conductively connected to the drain of a metal oxide semi-conductor field effect transistor (MOSFET). The photodiodes are of a polycrystalline or amorphous material.

The Berger et al U.S. Pat. No. 4,810,881 describes an amorphous silicon detector of 36 cm×43 cm. Each pixel in the detector includes an amorphous silicon diode that is conductively connected in series to a capacitor which in turn are both then conductively connected to the drain of an amorphous silicon base junction field effect transistor.

Neither detector of U.S. Pat. Nos. 4,689,487 and 4,810,881 has a non-destructive image read-out capability.

SUMMARY OF THE INVENTION

The present invention includes a radiation detector device having an array of pixels. Each pixel includes a photodiode. The photodiode is connected to the gate of a thin film transistor. The photodiode generates a current when the device is subjected to x-rays. The detector of the present invention is capable of real-time, non-destructive read-out.

The photodiode of the present invention is sensitive to x-rays through use of a luminescent layer which has an x-ray sensitive phosphor. The luminescent layer may be disposed in a phosphor screen or the phosphor may directly overlie the photodiode. Alternatively, the photodiode may be of a composition that is sensitive to x-rays therefore eliminating the need of an x-ray sensitive phosphor.

DETAILED DESCRIPTION OF THE PREFERRED EMBODIMENTS

Figure 1:
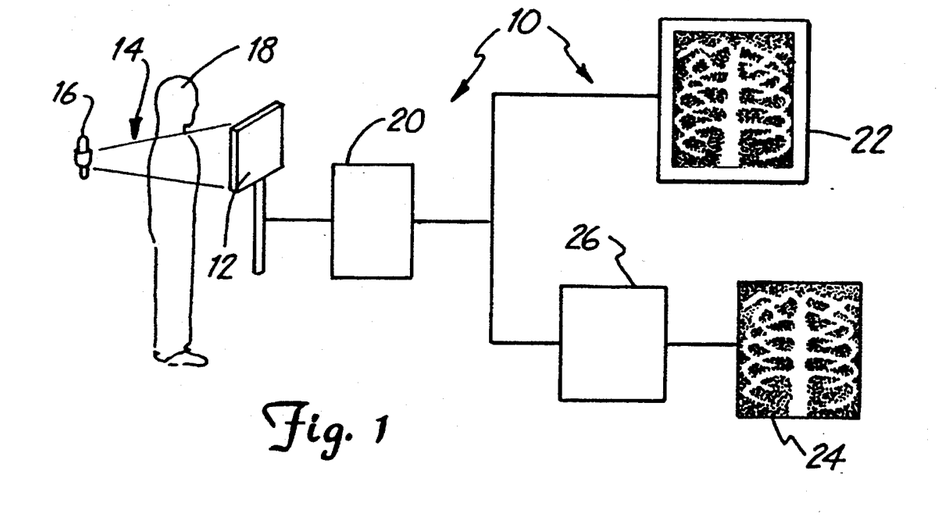
FIG. 1 is a schematic view of the present invention in a radiographic system.

An x-ray image detection apparatus of the present invention is generally illustrated at 10 in FIG. 1. The apparatus 10 includes a solid state x-ray detector 12. The solid state detector 12 detects x-rays 14 emitted from a source 16 that pass through a human body 18. An analog video signal is received from the detector 12 by a central processing unit 20 and is converted into a digital signal by an analog to digital converter and stored in memory. An image using the stored data may be projected on a display 22 or a hard copy 24 provided through a laser printer 26.

Figure 2:
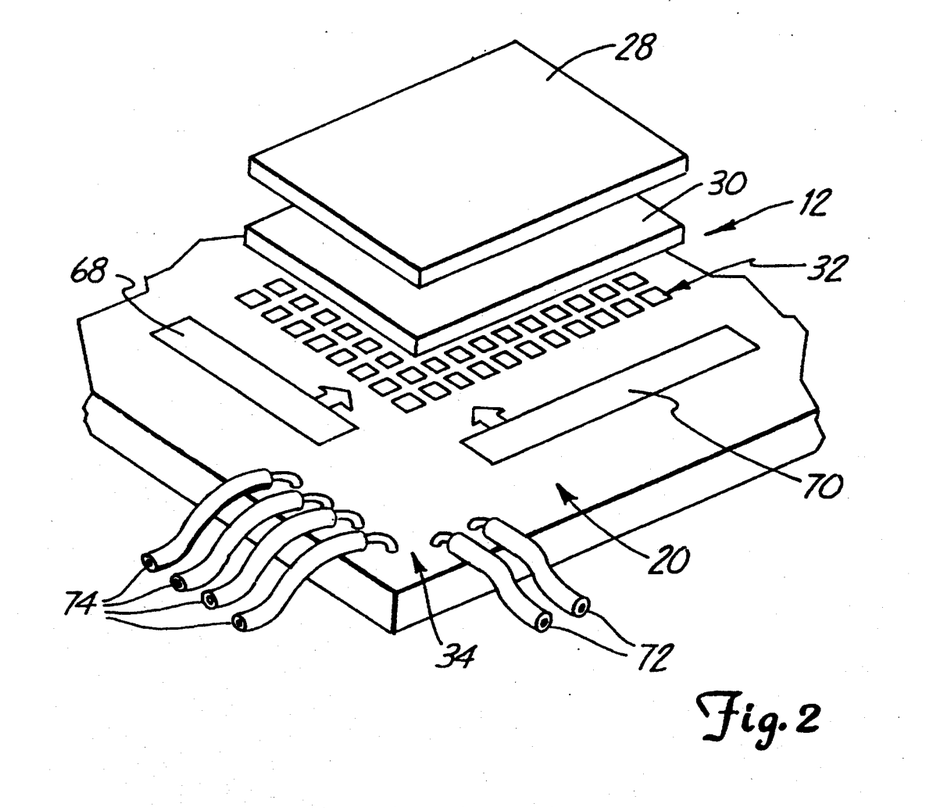
FIG. 2 is an exploded perspective view of the x-ray detector of the present invention.

The solid state radiation detector 12 is more fully illustrated in FIG. 2. The detector 12 includes a luminescent layer 28 containing an x-ray sensitive phosphor, an amorphous silicon Schottky barrier diode array layer 30, a polysilicon thin film transistor (TFT) array layer 32, and read-out circuitry 34. The phosphor in the luminescent layer converts incident x-rays to corresponding visible light radiation. The amorphous silicon Schottky barrier diode array generates an electrical signal corresponding to the intensity of light from the luminescent layer 28. Current generated in the photodiode array 30 is fed to the gates of associated TFT's.

The read-out circuitry 34 is used to amplify the electrical signal and convert the analog signal into digital, and store the signal in memory so that the signal may be used in an optical or electrical display. The detector can either be made on a single module or a multi-module (tiled structure), which has the read-out circuitry 34 incorporated on the same substrate. The read-out circuitry is based on high mobility polysilicon technology which is known in the art and is located along the periphery of the module or multi-module structure.

Figure 3A:
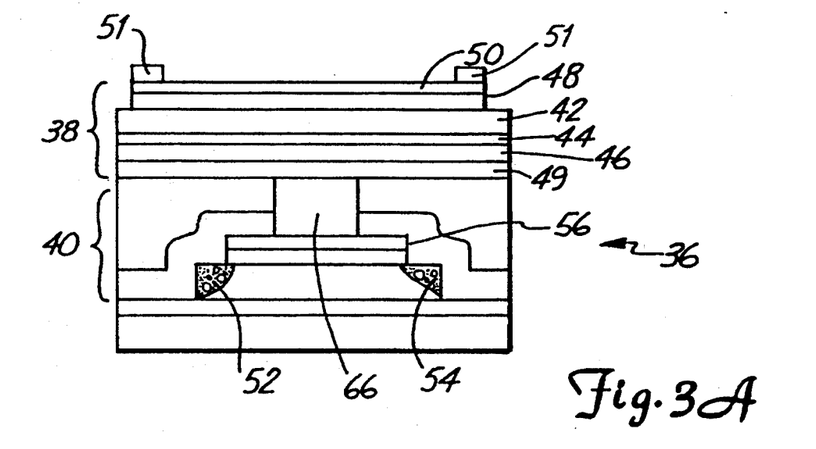
FIG. 3a is a sectional view of a pixel unit of the detector of the present invention.

The detector 12 is composed of a plurality of pixels. An exemplary pixel 36 is illustrated in FIG. 3a without the luminescent layer 28. Each pixel 36 has an amorphous silicon Schottky diode 38 preferably overlaying a polysilicon thin film transistor 40. The photodiodes can also be positioned such that the diodes exist in a side-by-side relationship with the TFTs. The photodiodes alternatively can be of a p-i-n form where p is a p-type doped amorphous silicon, i is an undoped amorphous silicon, and n is an n-type doped amorphous silicon, or the photodiode may be of an MIS arrangement wherein M is metal, I is an insulating layer, and S is an undoped amorphous silicon. Pixel area sizes of $420^2$ microns$^2$, $220^2$ microns$^2$, $120^2$ microns$^2$, and $80^2$ microns$^2$ have been produced. Production of pixels having an area of $50^2$ microns$^2$ or smaller is believed to be possible with no anticipated problems.

The thin film transistor 40, in turn, is disposed on a substrate such as a silicon wafer. However, a quartz substrate or glass substrate is preferred due to the larger area that such substrates provide.

The Schottky barrier diode 38 includes an undoped hydrogenated amorphous silicon layer 42 adjacent a doped hydrogenated amorphous silicon layer 44 with the two layers 42 and 44 being sandwiched by a conductive layer 46 and a metal layer 48. The Schottky barrier is formed between metal layer 48 and undoped amorphous silicon layer 42. The metal layer 48 has been preferably annealed in a hydrogen atmosphere. A layer of lead 49 or other heavy metal such as tungsten or platinum is disposed between the conductive layer 46 and the thin film transistor 40 for protection of the transistor from x-rays. The diode 38 may additionally include a transparent conductive oxide or other optical matching layer 50 as a top layer. For outside connection, a layer of metal 51 is deposited at the periphery of the diodes.

The thin film transistor includes a source 52, a drain 54, and a polysilicon gate 56. The gate of the thin film transistor is conductively connected to the conducting layer 46 of the diode 38 preferably by a metal contact 66. The current generated in the Schottky barrier diode 38 by the incident x-rays is fed to the gate of the TFT and changes the magnitude of the drain source current to the transistor. The potential on the TFT gate is slowly dispersed and readings from the drain source current can be made over prolonged periods of time. The charge storage time on the gate 56 is in the range of 20 to 30 seconds, and therefore several of the readings can be made for each x-ray exposure of the device of the present invention. The ability to take several readings permits reduction of noise by averaging the readings, and thereby, enhancing the signal to noise ratio of the detector.

The read-out circuitry 34 includes a shift register 68 and a multiplexer 70 for providing a mechanism to transmit signals for amplification, conversion from analog into digital, and for storing such signals in memory in the central processing unit 20. Outputs 72 for video display of the storage signal, or output 74 for further processing of the signal by a laser printer are also provided.

The amorphous silicon Schottky barrier diode of the present invention exhibits a dark current in the range of $10^{-11}$ A/cm$^2$, a forward current in the range of $10^{-2}$ to $10^{-1}$ A/cm$^2$, and the ratio of photocurrent over dark current is approximately $10^4$ at low levels of illumination, that is 1.0 to 10 $\mu$W/cm$^2$.

Figure 4:
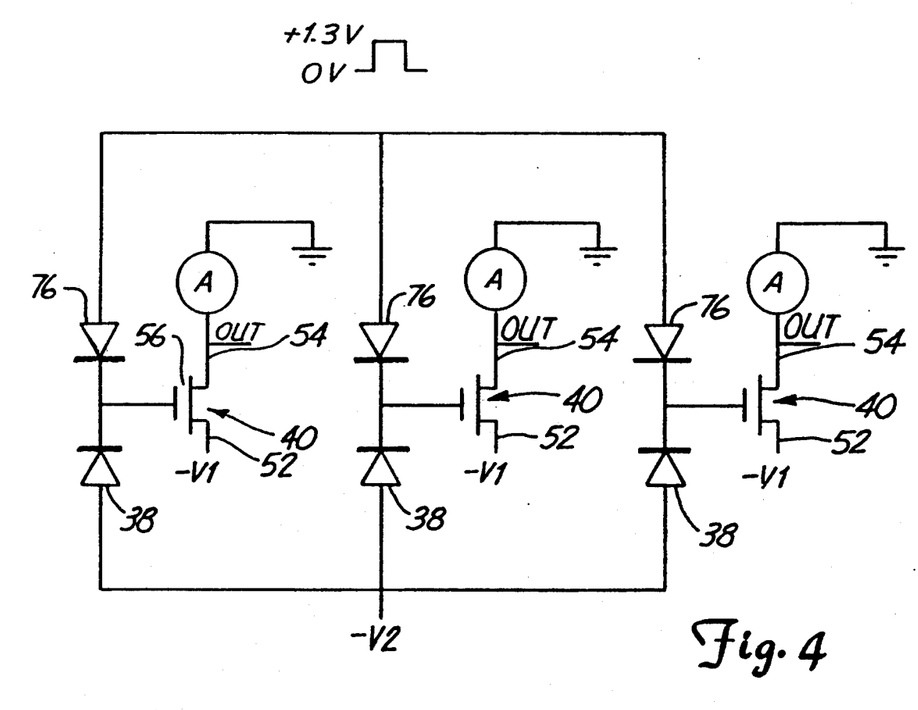
FIG. 4 is a circuit diagram of a pixel unit of the present invention including a blocking diode.

To prevent photocurrent from one photodiode in the array reaching an adjacent photodiode, a blocking diode 76 is provided in association with each photodiode 38, as illustrated in FIG. 4. As also shown in FIG. 4, source 52 of the thin film transistor is coupled to a first terminal having a first potential $-V1$, and drain 54 of the thin film transistor is coupled to a second terminal having a second, ground potential. The cathode of photodiode 38 is coupled to gate 56 of the thin film transistor, and the anode of photodiode 38 is coupled to a third terminal having a third potential $-V2$. The cathode of blocking diode 76 is coupled to the cathode of photodiode 38 and to gate 56 of the thin film transistor, and the anode of blocking diode 76 is coupled to a fourth terminal having a fourth potential pulsed between approximately 0 volts and 1.3 volts.

Figure 3B:
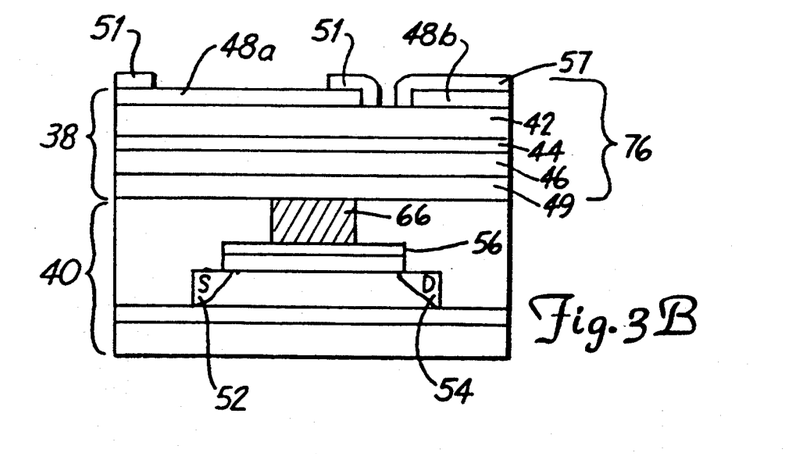
FIG. 3b is a sectional view of a pixel unit of the detector of the present invention including a blocking diode.

As further illustrated in FIG. 3b, in which like reference characters are used to indicate like elements that were illustrated in FIG. 3a, the polysilicon TFT 40 is essentially the same as described with reference to FIG. 3a. Situated on top of the polysilicon TFT is the photodiode 38 and the blocking diode 76. The photodiode 38 and the blocking diode 76 have the conductive layer 46, the doped hydrogenated amorphous silicon layer 44 and the undoped amorphous silicon layer 42 as common layers. In addition, the lead layer 49 may also be included between the conductive layer 46 and the TFT 40.

To form the photodiode and the blocking diode, a metal layer 48a and 48b is formed in much the same way as metal layer 48 in FIG. 3a. However, using conventional patterning techniques, distinct layers 48a and 48b are formed such as to be conductively separated to form the photodiode 38 and the blocking diode 76. Both layers 48a and 48b are preferably made of platinum. Area ratios of the blocking diode to the photodiode are in the range between 1:22 to 1:1.

A metal layer 57 is deposited on the metal layer 48b of the blocking diode 76 for connection to the read-out circuitry and in a thickness sufficient enough so that no light penetrates the blocking diode. A sufficient thickness is in the range of 2,000–5,000 Å.

The photodiode also includes the metal layer 51 deposited at the periphery to provide a connection to the read-out circuitry.

Figure 5:
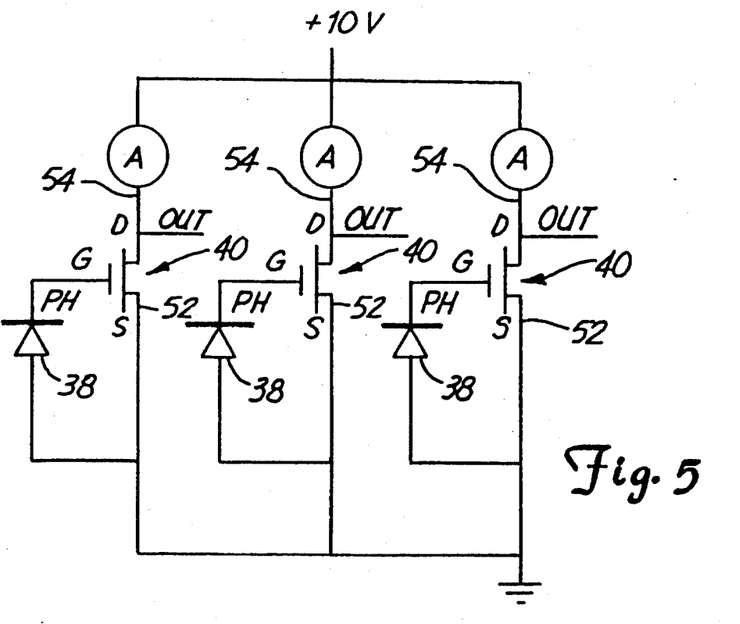
FIG. 5 is a circuit diagram of a pixel unit without a blocking diode of the present invention.

The prevention of photocurrent traveling between adjacent photodiodes is also resolved by the arrangement illustrated in FIG. 5. In FIG. 5, the TFT 40 is biased in an opposite manner from the arrangement of FIG. 4, permitting the elimination of the blocking diode.

The x-ray sensitive phosphor for use in the detector of the present invention may be chosen from those well-known in the radiographic art for use in intensifying screens. Such phosphors include, but are not limited to, gadolinium oxysulfide doped with terbium or europium, yttrium oxide, calcium tungsten, barium fluorochloride doped with europium, barium sulfate or strontium sulfate doped with terbium or thulium or dysprosium, and zinc sulfide.

The phosphor may be situated individually over each pixel in microcolumns with a column size equal to the photodiode size. The individual microcolumn arrangement confines the scattered emitted light to the area of the associated pixel. If the diode is initially deposited on the substrate and the TFT formed on the diode, the phosphor can then be embedded directly into the substrate.

Conventional screens are also contemplated as part of the present invention. The use of such screen results in some spreading of the emitted light which causes a reduction in the image sharpness.

The use of columnar phosphor results in greater image sharpness since the emitted light is confined to the column area. In addition, since the scattered emitted light is confined, the thickness of the phosphor layer can be increased without loss in image sharpness. Increasing the thickness of the phosphor provides greater absorption of incident x-rays thereby improving the sensitivity of the detector.

Techniques for producing columnar phosphor are known in the art. European patent application Publication 0 175 578 describes the use of columnar phosphor layers selected from barium sulfate doped with terbium or thulium or dysprosium, strontium sulfate doped with terbium or thulium or dysprosium and alkali halides. Such phosphor layers may be formed by vacuum evaporation, sputtering, or other vacuum deposition techniques known in the art. Columnar phosphor screens including oxysulfides of gadolinium or lanthanum are described in U.S. Pat. No. 4,069,355. Such structured phosphors are made by vapor deposition techniques.

The read-out scheme and the detector structure of the present invention can also be applied to the detector where the photodiodes are directly sensitive to the x-rays. Photodiodes which are directly sensitive to x-rays provide an x-ray sensor without the necessity of a phosphor layer. Photodiodes and also blocking diodes according to this embodiment may be diodes having an x-ray sensitive layer such as Se, PbSe, $PbS_xSe_{1-x}$, CdTe, HgCdTe, SeTe or other high atomic number materials.

The structure of the Se diodes can be, for example, Schottky barrier type of transparent conductive oxide/Se/metal, transparent conducting oxide CdSe/Se/metal. The structure of CdTe diodes can be, for example, transparent conducting oxide/CdSe/CdTe/metal. The structure of HgCdTe diodes can be, for example, transparent conducting oxide/CdS/HgCdTe/metal. The photodiodes directly sensitive to x-rays may be made by using thin film deposition techniques known in the art such as evaporation, sputtering, or electrodeposition. Thickness of the x-ray sensitive layer is in the range of 10 μm to 500 μm.

The following examples are for illustrative purposes only and are not intended to limit the present invention in any way. The examples are being submitted in order to illustrate more explicitly the process and product of the present invention.

EXAMPLE 1

A linear array solid state x-ray radiation detector was made by first growing a layer of silicon oxide of approximately one micron thickness on a 3-inch wide silicon wafer. The one micron layer of silicon oxide was used as an insulator. A second layer of amorphous polysilicon was formed using low pressure chemical vapor deposition of approximately 1,500 Å thickness at approximately 560° C. at 180 m Torr. Plasma-enhanced chemical vapor deposition could also have been used to form the polysilicon amorphous layer.

The wafers containing the two layers were then annealed in a nitrogen atmosphere of approximately 1.5 Torr and at approximately 620° C. for 24 hours to form a crystalline polysilicon layer. The grain size of the crystalline polysilicon ranged from 500 Å–3,000 Å.

The now crystalline polysilicon layer was patterned using photo-lithographic techniques into discrete islands. A 1,000 Å thick amorphous silicon oxide layer for the gate was grown at approximately 1,050° C. as a dielectric layer. Using low pressure chemical vapor deposition, a polysilicon layer of approximately 3,500 Å thickness to be used as the gate of the to be formed transistor was deposited and patterned.

An n+-type silicon drain and source were formed by implanting phosphorus by ion beam deposition at a level of about $10^{15}$ atom/cm$^2$. The phosphorus implantation was done before the formation of via holes through the amorphous silicon oxide. After implantation, the phosphorus was activated during a 30 minute annealing process in a nitrogen atmosphere at approximately 1,050° C.

If implantation were to be performed after the formation of via holes through the amorphous silicon oxide, the thickness of the polysilicon gate can be reduced from 3,500 Å to a range of 500 Å to 1,500 Å. The reduced thickness of the polysilicon gate will enhance the effectiveness of subsequent plasma hydrogenation as will be described below.

Aluminum was then deposited for the gate electrode by sputtering. Aluminum-silicon-copper alloy/chromium may also be used as the material for the gate electrode. The device was then annealed in a forming gas containing 15 percent hydrogen and 85 percent nitrogen to improve the contact between the aluminum and the silicon. The annealing was followed by plasma hydrogenation in a mixture of 50 percent nitrogen and 50 percent hydrogen at 300° C. for 30 minutes. Annealing times of up to one hour have been successfully employed. An insulating layer of 3,000 Å of $SiO_x$ was initially deposited and then a layer of 3,000 Å thickness of $SiN_x$ was deposited on the annealed device as a combined insulation layer. Both the $SiO_x$ and $SiN_x$ was deposited by plasma-enhanced chemical vapor deposition. The $SiN_x$ layer is deposited on top of the gate electrode of the TFT to optimize the amount of hydrogen incorporated into the grain boundaries during the plasma hydrogenation. The $SiN_x$ layer reduces the number of trapping defects and reduces the leakage current of the TFT.

Chromium metal plugs were used to fill the via holes through the $SiN_x/SiO_x$ layer to the gate electrodes of the now formed thin film transistors. An aluminum-chromium alloy may also be used to form the metal plugs, although the metal plugs can be made of any suitable metal.

Prior to the photodiode formation, Probimide 408 sold by Ciba-Geigy Corporation of Ardsley, N.Y., was deposited by spin coating to planarize the surface of the thin film transistors. Approximately a 1 µm thickness of the Probimide was deposited. Other types of polyimide or spin-on glass may be substituted for the Probimide in a thickness range of approximately 1 µm to 2 µm. The Probimide layer improves the performance of the detector since the planarization reduces and/or smooths out the slope in the photodiode. Planarizing the surface on which the photodiode rests will reduce possible high electric fields across the photodiode. When the thickness of the photodiode is too thin, the field is high at a given voltage. A high electric field across the device can deteriorate or destroy the device.

Prior to the formation of the Schottky barrier diode, a 1 to 2 micron layer of lead was deposited on the Probimide 408. The lead serves to reduce the x-rays that may be received by the thin film transistors. Other metals of a high atomic number that have a high x-ray absorption such as tungsten or platinum may also be used.

Next, a Schottky barrier diode was formed by initially depositing an electrode layer of chromium of an approximate thickness of 1,000 Å to 5,000 Å by sputtering. Next, a phosphorus doped n-type amorphous silicon was deposited on to the layer of chromium, using plasma-enhanced chemical vapor deposition. Prior to deposition any $CrO_x$ occurring on the chromium surface was treated in an argon plasma. Hydrogen in place of argon may be used. The chromium in the doped amorphous silicon layers was patterned by using wet etching solution techniques. The etched patterns of chromium and n-type phosphorus doped amorphous silicon were dipped in a solution of 2 percent HF in deionized water to remove any native $SiO_x$ on the doped amorphous silicon surface. The native $SiO_x$ can also be removed using an in-situ anhydrous fluoride cleaning step. The anhydrous fluoride cleaning step would be preferred in a manufacturing setting and for least impact on the environment.

Next, an undoped layer of amorphous silicon of approximately 5,000 Å thick was deposited on the doped amorphous silicon layer.

Both the doped amorphous silicon layer and the undoped amorphous silicon layer were deposited in a plasma-enhanced chemical vapor deposition system. The gases used in the deposition system were silane ($SiH_4$) and pure hydrogen for undoped amorphous silicon, and for phosphorus doped amorphous silicon, silane, phosphine and hydrogen and hydrogen were used. The substrate temperature was kept as 250° C. The amorphous silicon was not patterned. However, the amorphous silicon may be patterned to form islands by using microlithographic techniques.

The surface of the undoped amorphous silicon layer was then treated by dipping in two percent HF in deionized water to remove native $SiO_x$. The native $SiO_x$ can also be removed by using an in-situ anhydrous fluoride cleaning step.

A platinum layer of approximately 150 Å thick was sputtered on to the undoped a-Si:H layer. The platinum layer was then patterned for a top electrode to form the blocking diode and the photodiode using a liftoff etch technique. The area of the photodiode and the area of the blocking diode for each pixel are determined by area of the platinum layer. The area ratio is varied from 1:1 to 1:22. The platinum layers of the blocking diode and the photodiode are separated by the amorphous silicon layer. To reduce the defects at the a-Si:H/platinum interface, the diodes were annealed in a hydrogen atmosphere at a temperature of approximately 300° C. for approximately 1 to 1.5 hours.

A first layer of $SiO_x$ of approximately 2,000 Å thickness and then a second layer of $SiO_x$ of approximately 1,500 Å thickness was deposited using plasma-enhanced chemical vapor deposition as an insulator. The two layers of $SiN_x/SiO_x$ were patterned such that the platinum layer was disposed to serve as an electrode.

An aluminum top electrode layer was then deposited by sputtering. The aluminum may also be deposited by E-beam evaporation. The top aluminum electrode layer was then patterned using a lift-off etching technique. A wet etching technique may also be used. To further improve the contact and the device performance, the array of devices was annealed in a forming gas atmosphere at approximately 275° C. for approximately 1 hour.

Other metals for the gate, drain, and source of the TFT may also be used such as aluminum-copper-silicon alloy, aluminum-chromium double layer, tungsten silicide, or other metal silicides. Alternatively, the polysilicon thin film transistor can also be made in p-type, such that the drain and source are doped with a p-type dopant such as boron. The boron doping is done using ion-implantation techniques.

Figure 6:
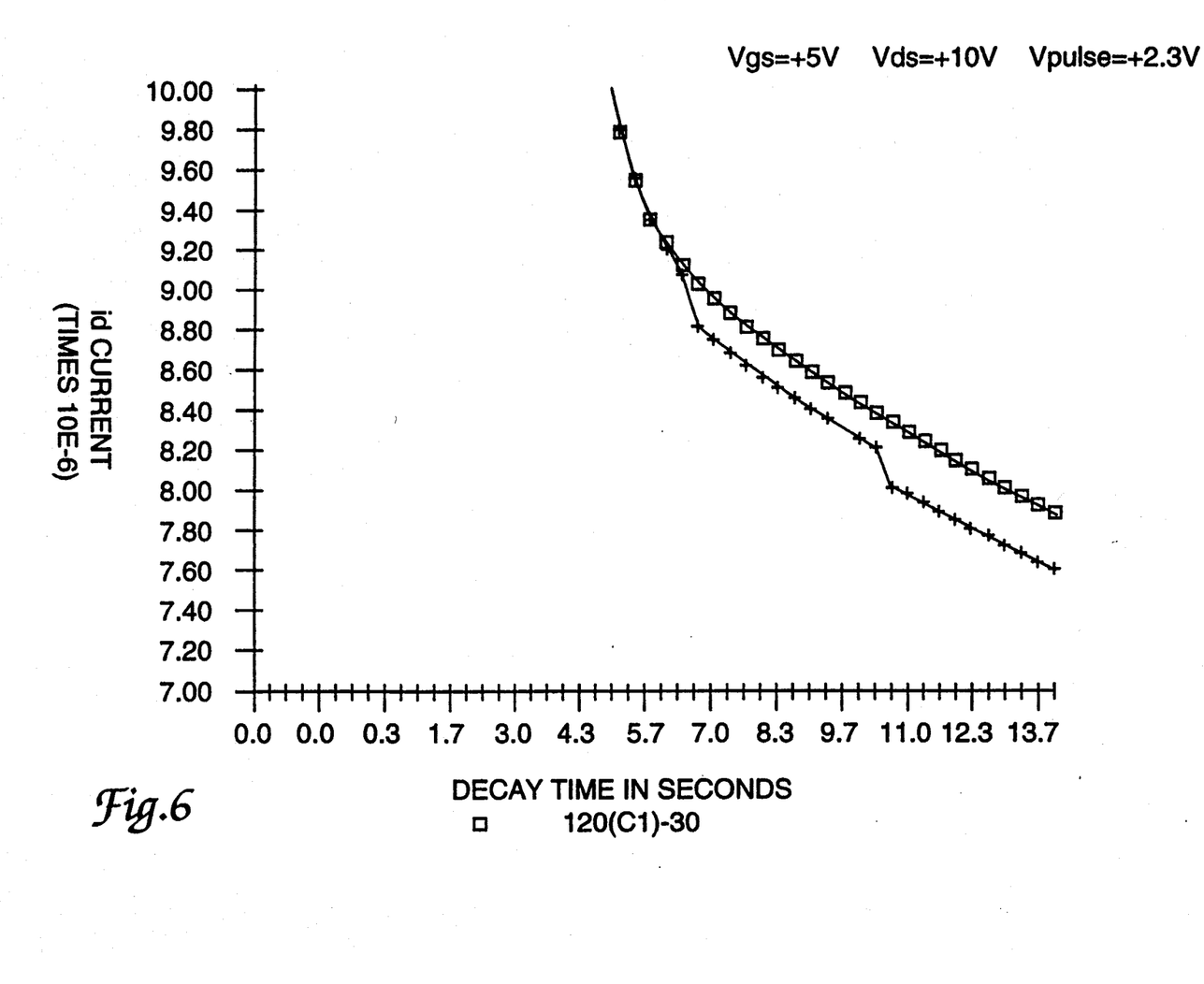
FIG. 6 is a graphical view of the response of an integrated detector of the present invention to illumination by light of wavelength λ.

The response of the detector produced in this example with visible light of 1 $\mu W/cm^2$ is illustrated in FIG. 6. The testing circuitry used to obtain the data of FIG. 6 is illustrated in FIG. 4. The data of FIG. 6 indicates that the detector is sensitive to a very low light level, which corresponds to a medical x-ray dose of 1 to 5 mR.

Figure 7:
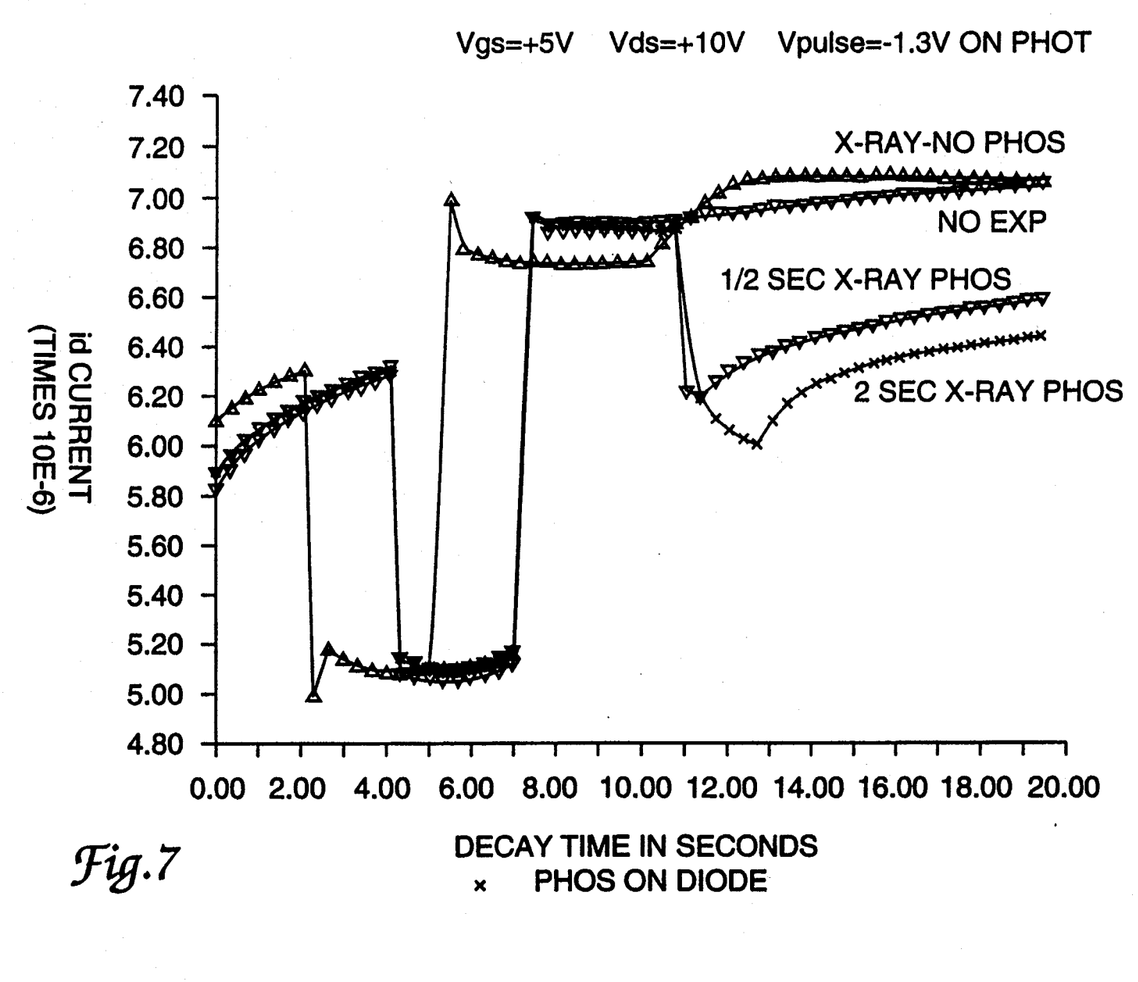
FIG. 7 is a graphical view of the response of a linear array of 32 pixel units of the present invention to a medical radiographic dose of x-rays.

Similar results were observed when the detector was exposed under a medical x-ray dose of 90 kVp at 200 mA for 2 seconds with an aluminum filter thickness of 20 mm. These results are illustrated in FIG. 7. The detector was sensitive down to less than 1 mR using a 3-M Trimax B12 intensifying screen at 90 kVp at 200 mA for 16 ms with an x-ray source being at a distance of 1 meter from the detector.

EXAMPLE 2

A 32 pixel linear array detector was fabricated using techniques similar to those described in Example 1, except that the platinum layer was not patterned to form a blocking diode instead the entire area of the platinum layer was used for the photodiode.3

Figure 8:
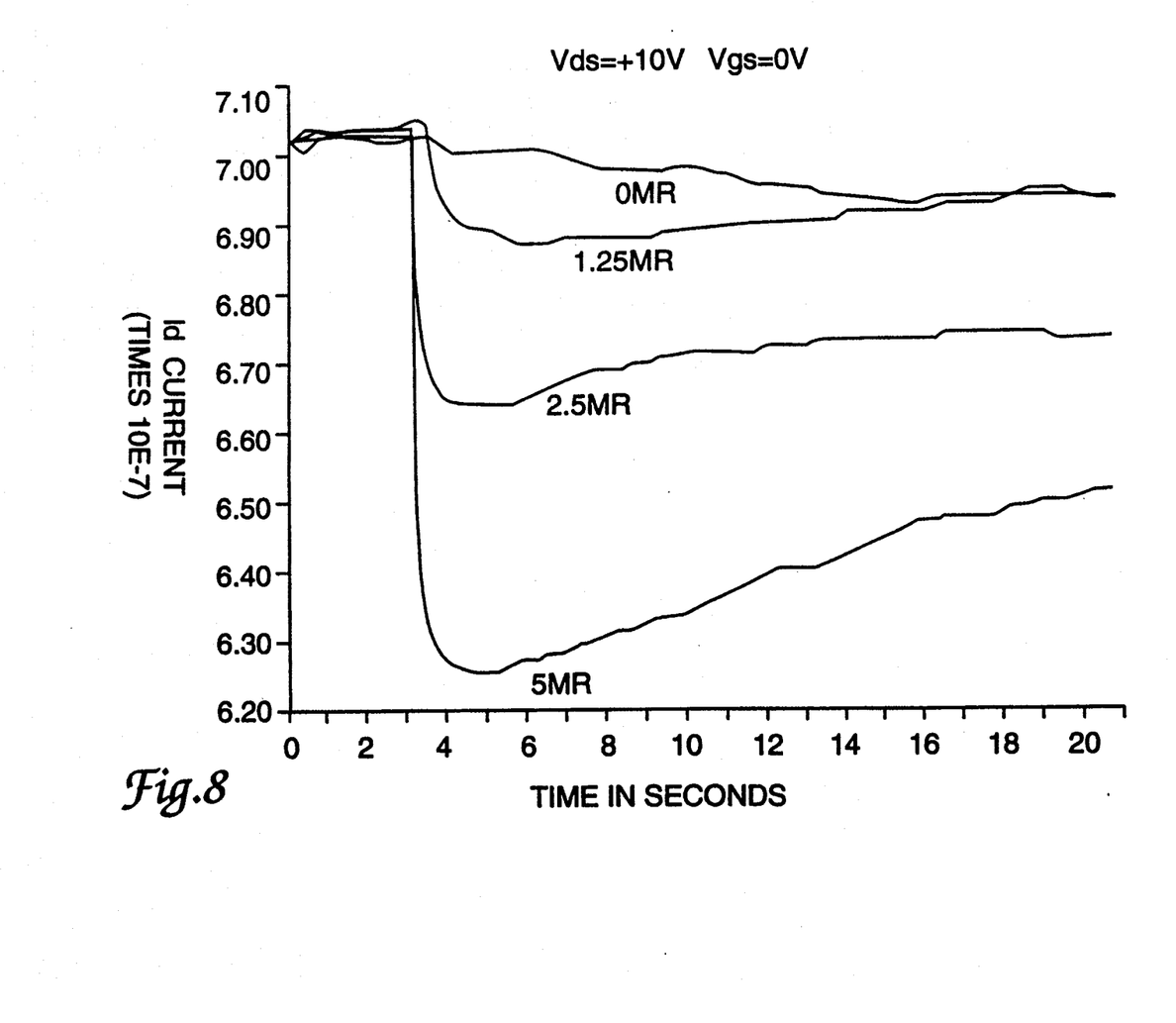
FIG. 8 is a graphical view of the thin film transistor output current of the detector of the present invention over time in response to various levels of x-ray exposure.

The 32 pixel linear array detector was tested using x-ray exposures from 1.25 mR to 5 mR. A 3-M Trimax B12 intensifying phosphor screen was used. A graph of the TFT output current before and after x-ray exposures of 5 mR, 2.5 mR, 1.25 mR, and 0 mR are illustrated in FIG. 8. The graph of FIG. 8 indicates that the output current can be read several times after exposure with the signal being present for at least 20 seconds after the x-ray exposure. The ability to read a single exposure several times improves the signal-to-noise ratio of the detector.

EXAMPLE 3

Figure 9:
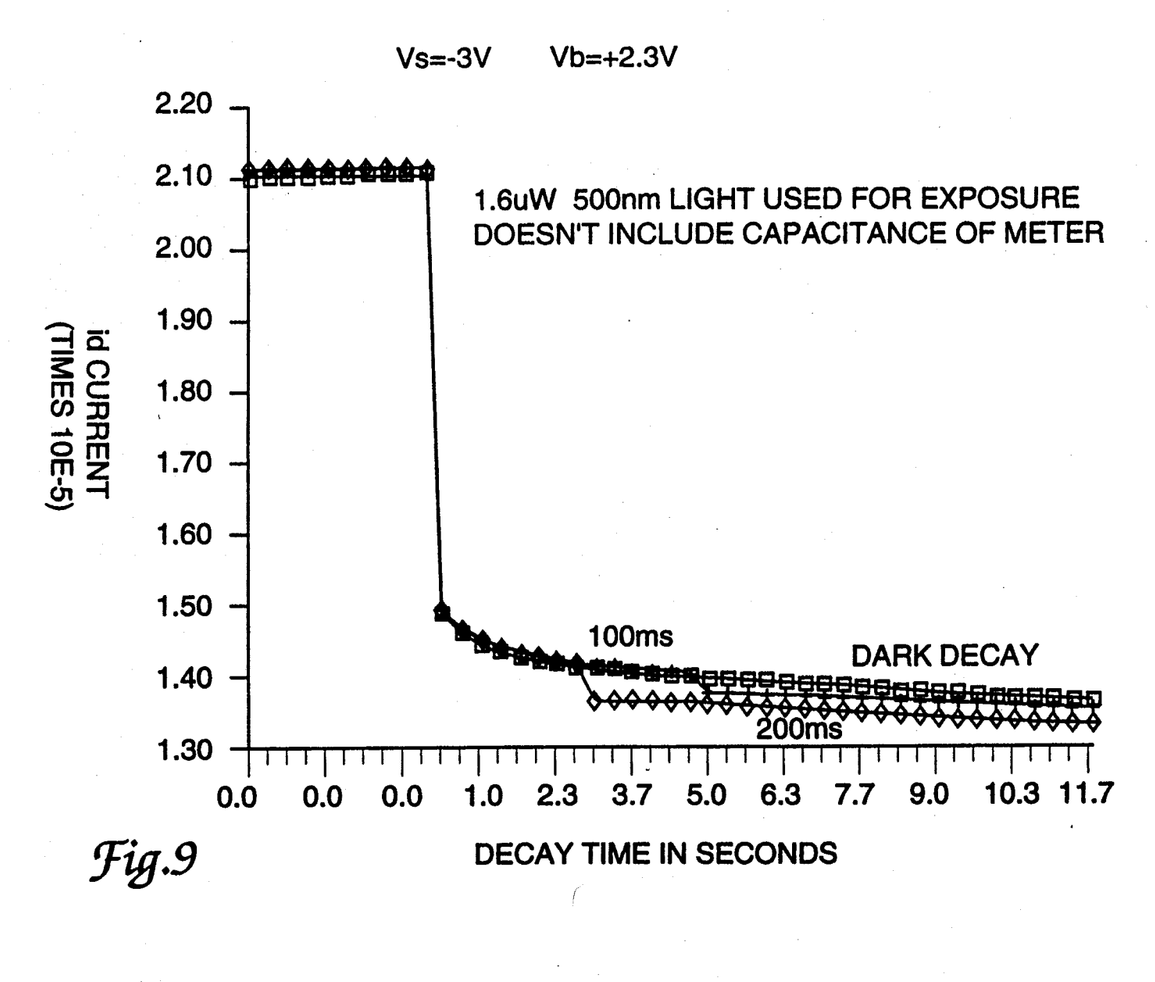
FIG. 9 is a graphical view illustrating the response of a hybrid linear array 32 units pixel of the present invention to a medical radiographic dose of x-rays.

A hybrid detector array was made by bonding by wiring a 1×32 amorphous silicon photodiode array to a 1×32 polysilicon thin film transistor array to form a hybrid detector. The photodiode array and the polysilicon TFT array were produced using techniques similar to those described in Example 1. The photodiodes and the TFTs were produced on two separate substrates. A linear array of photodiodes and a linear array of TFTs were bonded by cutting the photodiode array and TFT arrays previously formed and then bonding the diodes and TFTs together at their cut edges by soldering. The hybrid detector was used to optimize the circuit design for the detector. The hybrid detector of Example 3 provides freedom to select the best diode array and the best TFT array and to combine the two to produce an array that will have maximum performance. The hybrid detector was exposed to 1.6 μW of wavelength 550 nm and the results are shown in FIG. 9 for two different exposure times of 100 msec. and 200 msec.

The hybrid detector of this example using a 3-M Trimax B12 phosphor screen and aluminum filters of 3.17 mm and 20 mm was exposed to a 90 kVp x-ray tube 200 mA for 200 msec.

Drain-source current of 2 μA was observed using the aluminum filter of 3.17 mm. Drain-source current of 0.6 μA was observed when using the 20 mm aluminum filter. The decay time using the detector of this example was as long as 15 seconds and allowed several readings for one exposure thereby enhancing the signal-to-noise ratio of the final recorded signal.

EXAMPLE 4

To increase the final output signal of the detector, a second polysilicon TFT could be added to the already existing polysilicon TFT of the detector in Example 2. The gate of the second TFT is connected to the drain of the first TFT in each pixel. Both TFTs can be fabricated using techniques similar to those described in Example 1.

Figure 11:
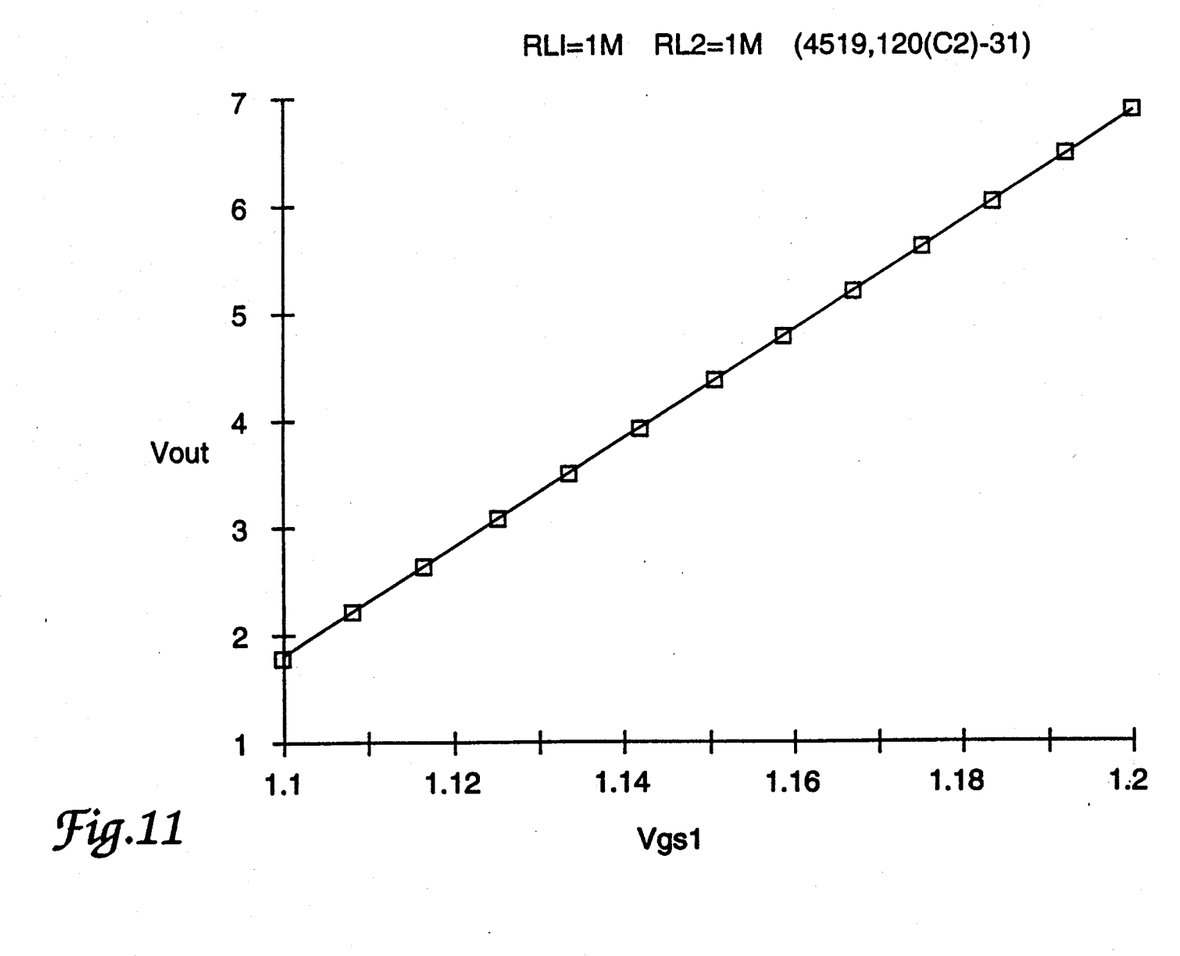
FIG. 11 is a graphical view illustrating the amplification ratio of the second TFT.

The calculated results indicate an amplification ratio of up to 50 times using the second TFT, as illustrated in FIG. 11.

EXAMPLE 5

Figure 10:
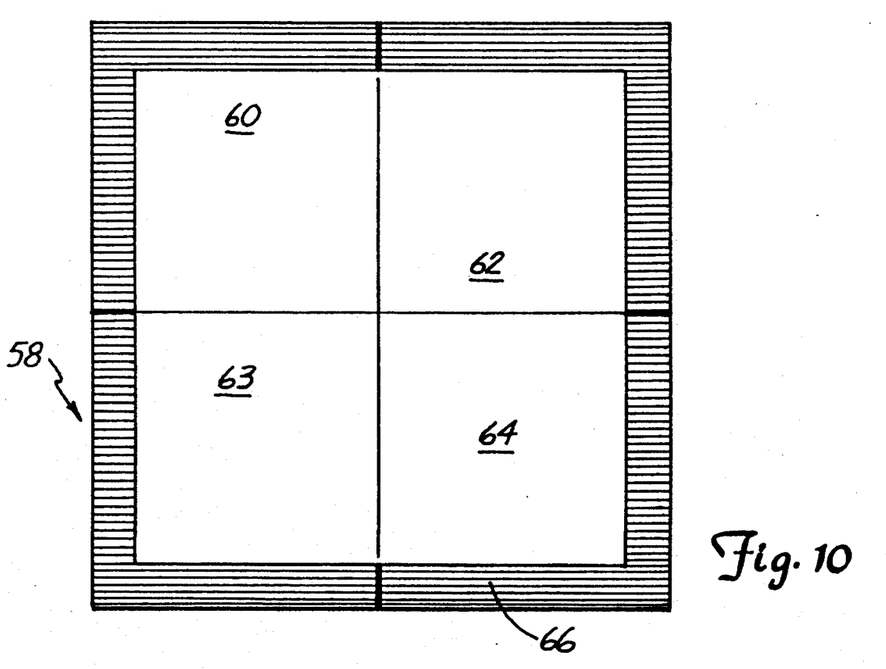
FIG. 10 is a diagrammatic view of a two-dimensional array detector of the present invention constructed in a modular manner.

A large area x-ray sensor 58 of 14 inches×17 inches is made from four 7 inch×9 inch sensor array modules 60, 62, 63, and 64 as illustrated in FIG. 10. Each module has a 2,000×2,000 photodiode-TFT array. Electronic circuitry is arranged at the corners of each of the modules. An integrated scanner 66 is built simultaneously with the diode/TFT pixel matrix using known thin film deposition techniques resulting in a fully integrated drive circuit inactive matrix as illustrated in FIG. 10. Each module is in overlapping relationship with an adjacent module by a distance that is less than the pixel size, which in this example is approximately 80 μm. No imaging loss due to the addition of the drive circuity is anticipated since the drive circuitry is outside the viewing area and can be fully redundant.

For high mobility polysilicon-based CMOS devices for integrated scanner circuitry, laser annealed rapid thermally annealed polysilicon may be used for this device.

Although the present invention has been described with reference to preferred embodiments, workers skilled in the art will recognize that changes may be made in form and detail without departing from the spirit and scope of the invention.

What is claimed is:

1. A radiation detector comprising:
   a plurality of pixel areas arranged in an array;
   a plurality of thin film transistors, each of said plurality of thin film transistors being disposed within a respective one of said plurality of pixel areas, and each of said plurality of thin film transistors having a gate, source, and drain, wherein said source is coupled to a first terminal having a first potential, and said drain is coupled to a second terminal having a second potential;
   a plurality of photodiodes, each of said plurality of photodiodes being disposed within a respective one of said plurality of pixel areas, each of said plurality of photodiodes having a first electrode coupled to the gate of a respective one of said plurality of thin film transistors, and a second electrode coupled to a third terminal having a third potential, and each of said plurality of photodiodes generating current in response to X-ray radiation; and
   a plurality of blocking diodes, each of said plurality of blocking diodes being disposed within a respective one of said plurality of pixel areas, each of said plurality of blocking diodes having a first electrode coupled to the first electrode of a respective one of said plurality of photodiodes and to the gate of a respective one of said plurality of thin film transistors, and each of said plurality of blocking diodes having a second electrode coupled to a fourth terminal having a fourth potential, wherein each of said plurality of blocking diodes substantially blocks current flow from said first electrode of said respective one of said plurality of photodiodes to said fourth terminal, each of said plurality of blocking diodes thereby preventing said current generated by one of said plurality of photodiodes from leaking to other ones of said plurality of photodiodes disposed in other ones of said plurality of pixel areas.

2. The detector of claim 1 and further including an x-ray sensitive phosphor in light receiving association with each of said plurality of photodiodes.

3. The detector of claim 1 wherein each of said plurality of photodiodes includes an x-ray sensitive layer.

4. The detector of claim 1 wherein said plurality of pixel areas are disposed in a two-dimensional array having rows and columns, wherein said fourth terminal includes a plurality of separate fourth terminals, each of said plurality of separate fourth terminals being coupled to the second electrodes of ones of said plurality of blocking diodes disposed within respective ones of said plurality of pixel areas disposed in a respective one of said rows of said two-dimensional array.

5. The detector of claim 2 wherein the phosphor is disposed in a screen.

6. The detector of claim 2 wherein the phosphor is in a layer overlying each of said plurality of photodiodes.

7. The detector of claim 1 wherein each of said plurality of photodiodes is an amorphous silicon diode.

8. The detector of claim 7 wherein each of said plurality of photodiodes includes an undoped amorphous silicon layer and a doped amorphous silicon layer adjacent the undoped amorphous silicon layer, both of said undoped amorphous silicon layer and said doped amorphous silicon layer being sandwiched between the first and second electrodes of the respective one of said plurality of photodiodes.

9. The detector of claim 1 and further including an x-ray absorbing metal layer, the x-ray absorbing metal layer being in conductive contact with each of said plurality of photodiodes and the gate of each of said plurality of thin film transistors.

10. The detector of claim 7 wherein each of said plurality of photodiodes includes a p-type doped amorphous silicon layer, an undoped amorphous silicon layer, and an n-type doped amorphous silicon layer.

11. The detector of claim 7 wherein each of said plurality of photodiodes includes a metal layer, an insulating layer of 20 to 50 Å and an undoped amorphous silicon layer.

12. The detector of claim 1 wherein each of said plurality of photodiodes overlies said respective one of said plurality of thin film transistors.

13. The detector of claim 1 wherein each of said plurality of photodiodes is disposed in a side-by-side relationship with said respective one of said plurality of thin film transistors.

14. The detector of claim 1 and further including a plurality of amplifying thin film transistors, each of said plurality of amplifying thin film transistors being in conductive contact with a respective one of said plurality of thin film transistors such that the current from said respective one of said plurality of thin film transistors is amplified.

15. The detector of claim 1 and further including an insulating layer disposed between each of said plurality of thin film transistors and each of said plurality of photodiodes and including means for permitting conductive connection between the first electrode of each of said plurality of photodiodes and the gate of the respective one of said plurality of thin film transistors.

16. The detector of claim 6 wherein the phosphor is a structured phosphor having a column size equal to the photodiode size.

17. The detector of claim 1 and further including circuitry means for receiving and sending electronic signals from said plurality of pixel areas in the array.

18. The device of claim 17 wherein the circuitry means is disposed along the periphery of the array.

19. A radiation detector comprising:
a plurality of pixel modules arranged in an array, each of said pixel modules including a plurality of pixel areas arranged in a sub-array;
a plurality of thin film transistors, each of said plurality of thin film transistors being disposed within a respective one of said plurality of pixel areas, and each of said plurality of thin film transistors having a gate, source, and drain, wherein said source is coupled to a first terminal having a first potential, and said drain is coupled to a second terminal having a second potential;
a plurality of photodiodes, each of said plurality of photodiodes being disposed within a respective one of said plurality of pixel areas, each of said plurality of photodiodes having a first electrode coupled to the gate of a respective one of said plurality of thin film transistors, and a second electrode coupled to a third terminal having a third potential, and each of said plurality of photodiodes generating current in response to X-ray radiation;
a plurality of blocking diodes, each of said plurality of blocking diodes being disposed within a respective one of said plurality of pixel areas, each of said plurality of blocking diodes having a first electrode coupled to the first electrode of a respective one of said plurality of photodiodes and to the gate of a respective one of said plurality of thin film transistors, and each of said plurality of blocking diodes having a second electrode coupled to a fourth terminal having a fourth potential, wherein each of said plurality of blocking diodes substantially blocks current flow from said first electrode of said respective one of said plurality of photodiodes to said fourth terminal, each of said plurality of blocking diodes thereby preventing said current generated by one of said plurality of photodiodes from leaking to other ones of said plurality of photodiodes disposed in other ones of said plurality of pixel areas; and
circuitry means for receiving and sending signals from each of said plurality of pixel areas.

20. The detector of claim 19 wherein the circuitry means is disposed along the periphery of the pixel modules.

21. The detector of claim 19 wherein each of said plurality of pixel modules is in overlapping relationship with adjacent ones of said plurality of pixel modules by a distance that is less than the size of one of said plurality of pixel areas.

* * * * *